(12) United States Patent
Tamura et al.

(10) Patent No.: US 7,569,976 B2
(45) Date of Patent: Aug. 4, 2009

(54) PIEZO-ELECTRIC SUBSTRATE AND MANUFACTURING METHOD OF THE SAME

(75) Inventors: Noboru Tamura, Chuo (JP); Nakaba Ichikawa, Chuo (JP); Takeshi Takabatake, Kobe (JP); Kaname Yasuda, Kobe (JP)

(73) Assignees: Koike Co., Ltd., Yamanashi-ken (JP); Tocalo Co., Ltd., Kobe-shi (JP)

( * ) Notice: Subject to any disclaimer, the term of this patent is extended or adjusted under 35 U.S.C. 154(b) by 0 days.

(21) Appl. No.: 11/880,168

(22) Filed: Jul. 20, 2007

(65) Prior Publication Data

US 2008/0024037 A1 Jan. 31, 2008

(30) Foreign Application Priority Data

| Jul. 27, 2006 | (JP) | ............................. 2006-204739 |
| Jul. 27, 2006 | (JP) | ............................. 2006-204740 |
| Feb. 26, 2007 | (JP) | ............................. 2007-045044 |
| Feb. 26, 2007 | (JP) | ............................. 2007-045045 |

(51) Int. Cl.
*H01L 41/08* (2006.01)
(52) U.S. Cl. .................... 310/346; 310/311; 310/363
(58) Field of Classification Search ............... 310/311, 310/363, 346
See application file for complete search history.

(56) References Cited

U.S. PATENT DOCUMENTS

| 4,947,677 | A | | 8/1990 | Frye et al. |
| 5,224,972 | A | | 7/1993 | Frye et al. |
| 5,562,774 | A | * | 10/1996 | Breidenbach et al. ....... 118/715 |
| 6,831,340 | B2 | | 12/2004 | Araki |
| 7,067,956 | B2 | * | 6/2006 | Imai et al. ............... 310/313 D |

FOREIGN PATENT DOCUMENTS

| DE | 10248444 A1 | | 5/2003 |
| JP | 57003412 | | 1/1982 |
| JP | 2607199 B2 | | 2/1994 |
| JP | 09-208399 A | | 8/1997 |
| JP | 2004-343359 A | | 12/2004 |
| JP | 2005-229455 | * | 8/2005 |

OTHER PUBLICATIONS

European Search Report dated Nov. 19, 2007.

* cited by examiner

*Primary Examiner*—Thomas M Dougherty
(74) *Attorney, Agent, or Firm*—Michaud-Duffy Group LLP

(57) ABSTRACT

A piezo-electric substrate is mainly comprised of a base material and a film formed on one main surface of the base material. In the base material, the main surface on which the film is formed is a roughened main surface. The piezo-electric substrate is obtained by forming the film comprised of a material with a coefficient of linear expansion smaller than a coefficient of linear expansion of the base material on the roughened main surface using a thermal spraying method.

8 Claims, 7 Drawing Sheets

PIEZO-ELECTRIC SUBSTRATE AND MANUFACTURING METHOD OF THE SAME

CROSS-REFERENCE TO RELATED APPLICATIONS

The present disclosure relates to subject matters contained in Japanese Patent Application No. 2006-204739 filed on Jul. 27, 2006, Japanese Patent Application No. 2006-204740 filed on Jul. 27, 2006, Japanese Patent Application No. 2007-45044 filed on Feb. 26, 2007, and Japanese Patent Application No. 2007-45045 filed on Feb. 26, 2007, which are expressly incorporated herein by reference in their entireties.

FIELD OF THE INVENTION

The present invention relates to a piezo-electric substrate and a method of manufacturing the substrate, and more particularly, to a piezo-electric substrate for use in a surface acoustic wave-device and the like, and a method of manufacturing the substrate.

BACKGROUND OF THE INVENTION

A surface acoustic wave (SAW) device is a device obtained by forming comb-shaped electrodes on a piezo-electric substrate such as a lithium tantalate (LiTaO3) (LT) substrate, lithium niobate (LiNbO3) (LN) substrate and the like. This device has the function of an extremely miniature band-pass filter using electromechanical properties of piezo-electric material. In the SAW device, pitches of the order of micrometers of the comb-shaped electrodes are reflected in filter characteristics with sensitivity. Since the coefficients of thermal expansion of LT and LN are about six times that of silicon and thus large (Silicon: about $2.6\times10^{-6}$/K, LT: about $16\times10^{-6}$/K, LN: about $15\times10^{-6}$/K), when the LT substrate or LN substrate is used in the SAW device, variations in filter characteristics with changes in temperature become a significant problem. Therefore, it has been carried out to suppress such large thermal expansion and contraction of the piezo-electric substrate or make temperature compensation by other methods.

For example, when the SAW device is manufactured, it has been carried out to suppress expansion and contraction caused by changes in temperature of a piezo-electric substrate by boding a substrate with a small coefficient of thermal expansion to the piezo-electric substrate. It is disclosed in Patent Document 1 that an LT substrate and sapphire substrate are bonded using a direct joint method. Further, it is disclosed in Patent Document 2 that a piezo-electric substrate and monocrystal substrate are joined using junction by solid phase reaction. Furthermore, it is disclosed in Patent Document 3 that an LT (LN) substrate and silicon substrate are joined using junction by hydrophilic processing and heat treatment.

Patent Document 1: Japanese Laid-Open Patent Publication No. 2004-343359
Patent Document 2: Japanese Laid-Open Patent Publication No. H09-208399
Patent Document 3: Japanese Patent Gazette No. 2607199

In recent years, in cellular telephones and the like installed with the SAW device, many systems coexist with one another, and it is expected that frequency bands used in the systems are adjacent to one another. In such a case, it is required to minimize a frequency shift (the order of several megahertz). Accordingly, the piezo-electric substrate is required to vary filter characteristics due to changes in temperature as little as possible. However, in the piezo-electric substrate obtained by the method of bonding a substrate with a small coefficient of thermal expansion as in the conventional technique, it is not possible to deal with the requirement of making the frequency shift smaller. Accordingly, under present circumstances, the piezo-electric substrate capable of dealing with the requirement of making the frequency shift smaller is not yet in existence.

SUMMARY OF THE INVENTION

It is an object of the present invention to provide a piezo-electric substrate capable of sufficiently suppressing its expansion and contraction caused by changes in temperature and a method of manufacturing such a substrate.

A piezo-electric substrate of the present invention has a base material with a coefficient of linear expansion ranging from $10\times10^{-6}$/K to $20\times10^{-6}$/K having a roughened main surface, and a film that is provided on the main surface and that is comprised of a material with a coefficient of linear expansion ranging from $-1\times10^{-6}$/K to $10\times10^{-6}$/K smaller than the coefficient of linear expansion of the base material. According to this structure, since the film functions as a temperature compensation film, it is possible to obtain a piezo-electric substrate capable of sufficiently suppressing its expansion and contraction caused by changes in temperature.

According to the piezo-electric substrate of the invention, the film preferably has a porosity ranging from 5% to 40%. According to this structure, the film becomes relatively porous, and the stress subsequent to film formation is thereby small. Therefore, the film does not peel off the base material, and it is possible to form a thick film (of about several hundred micrometers).

According to the piezo-electric substrate of the invention, the film is preferably comprised of a laminate of molten or non-molten particles. In this case, the size of the particles preferably ranges from 5 μm to 300 μm.

According to the piezo-electric substrate of the invention, the material with the coefficient of linear expansion smaller than the coefficient of linear expansion of the base material is preferably at least one selected from a group consisting of Ti, W, Mo, Ta, Si and alloys thereof, aluminum oxide, silicon oxide, magnesium oxide, zirconium oxide, titanium oxide, silicon carbide, boron carbide, aluminum nitride, silicon nitride and solid solutions of compounds thereof, and mixtures of the metals and compounds.

According to the piezo-electric substrate of the invention, the film preferably has a thickness ranging from 0.05 mm to 2 mm.

According to the piezo-electric substrate of the invention, the base material is preferably comprised of a material selected from a group consisting of lithium tantalate, lithium niobate, quartz (SiO2), lithium borate (Li2B4O7) and zinc oxide (ZnO).

According to the piezo-electric substrate of the invention, an undercoat is preferably provided between the base material and the film.

A piezo-electric element of the invention has the above-mentioned piezo-electric substrate, and an element provided on another main surface on the side opposite to the roughened main surface of the piezo-electric substrate.

A method of manufacturing a piezo-electric substrate of the invention is characterized by having the steps of preparing a base material with a coefficient of linear expansion ranging from $10\times10^{-6}$/K to $20\times10^{-6}$/K having a roughened main surface, and forming on the main surface a film comprised of a material with a coefficient of linear expansion ranging from −1×10−6/K to 10×10−6/K smaller than the coefficient of linear expansion of the base material.

In the method of manufacturing a piezo-electric substrate of the invention, the film is preferably formed on the base material by a coating method using slurry or a thermal spraying method.

A method of manufacturing a piezo-electric element of the invention is characterized by having the steps of preparing a base material with a coefficient of linear expansion ranging from 10×10−6/K to 20×10−6/K having a roughened main surface, forming an element on another main surface on the side opposite to the roughened main surface, and further forming, on the roughened main surface of the base material with the element formed thereon, a film comprised of a material with a coefficient of linear expansion ranging from −1×10−6/K to 10×10−6/K smaller than the coefficient of linear expansion of the base material.

BRIEF DESCRIPTION OF THE DRAWINGS

The various features of novelty which characterize the invention are pointed out with particularity in the claims attached to and forming a part of this specification. For a better understanding of the invention, its operating advantages, and specific objects attained by its use, reference should be had to the accompanying drawing and descriptive matter in which there is illustrated and described a preferred embodiment of the invention.

FIGS. 6A to 6D are cross-sectional views to explain a method of manufacturing a piezo-electric substrate of the invention, while FIGS. 7A to 7D are cross-sectional views to explain a method of manufacturing a conventional piezo-electric substrate, while

DETAILED DESCRIPTION OF THE PREFERRED EMBODIMENTS

Embodiments of the present invention will specifically be described below with reference to accompanying drawings.

First Embodiment

Figure 1:
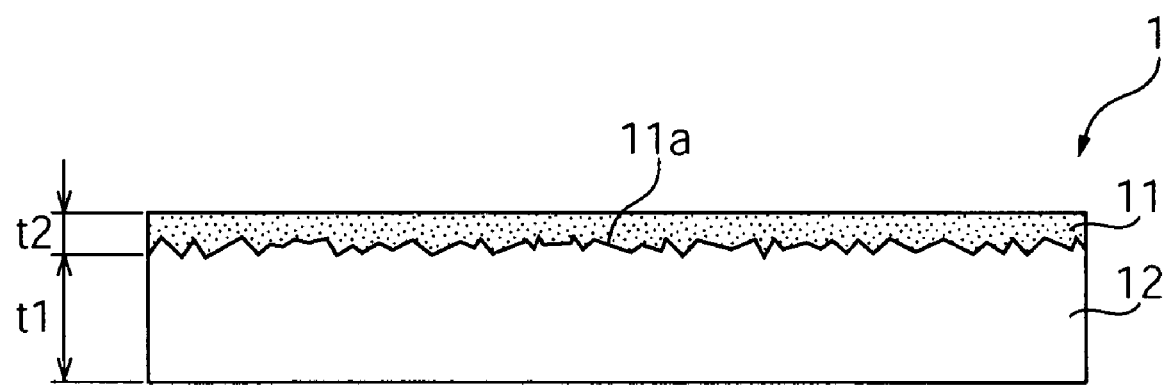
FIG. 1 is a cross-sectional view showing a piezo-electric substrate according to a first embodiment of the invention.

FIG. 1 is a cross-sectional view showing a piezo-electric substrate according to the first embodiment of the invention. A piezo-electric substrate 1 as shown in FIG. 1 is mainly comprised of a base material 11, and a film 12 formed on one main surface of the base material 11. In the base material 11, the main surface on which the film 12 is formed is a roughed main surface 11a.

The one main surface (backside: interface with the film 12) of the base material 11 is the roughened surface. For example, when the piezo-electric substrate is used in the SAW device, the standing wave on the surface by reflection of the bulk wave interferes with the surface wave. Therefore, to cause diffuse reflection of the bulk wave, the interface with the film 12 is roughened. It is thereby possible to suppress interference between the standing wave and surface wave. Further, also to improve the adhesion between the base material 11 and the film 12 described later, it is preferable that one main surface of the base material 11 is a roughened surface. In addition, as roughness of the main surface 11a, in consideration of the effect of suppressing interference between the standing wave and surface wave and the adhesion of the film 12 to the base material 11, it is preferable that Ra ranges 0.1 μm to 3 μm (Ra=0.1 μm~3 μm).

Selected as the base material 11 is a material with a coefficient of linear expansion ranging from 10×10−6/K to 20×10−6/K. Materials constituting the base material 11 include lithium niobate, quartz, lithium borate, zinc oxide and the like. Further, when the piezo-electric substrate 1 is used in the SAW device, to cause characteristics as the SAW device to be produced, the base material 11 needs to be thinned. A thickness t2 of the base material 11 is preferably in the range of about 10 μm to 100 μm, and more preferably, in the range of 20 μm to 60 μm.

The film 12 is directly formed on the roughened main surface 11a of the base material 11, and comprised of a material with a coefficient of linear expansion ranging from −1×10−6/K to 10×10−6/K smaller than the coefficient of linear expansion of the base material 11. Such materials with the coefficient of linear expansion smaller than the coefficient of linear expansion of the base material include metals such as Ti, W, Mo, Ta, Si and alloys thereof, and ceramic such as aluminum oxide, silicon oxide, magnesium oxide, zirconium oxide, titanium oxide, silicon carbide, boron carbide, aluminum nitride, silicon nitride and solid solutions of compounds thereof, and may include mixtures of the metals and compounds. Further, in consideration of no variation with time due to oxidation, good electrical insulation properties, small coefficient of linear expansion and the like, alumina-based (for example, alumina and alumina-silica based) materials are preferable.

In the piezo-electric substrate 1 of the invention, the film 12 is preferably comprised of a laminate of molten or non-molten particles. By the film 12 having such a structure, it is made ease to implement the porosity as described later. In this case, the size of the particles preferably ranges from 5 μm to 300 μm. Particularly, the size of the particles preferably ranges from 10 μm to 100 μm.

In the piezo-electric substrate 1 of the invention, since the thickness t2 of the base material 11 is extremely thin, the film 12 serves a function of holding rigidity of the piezo-electric substrate 1. Accordingly, in consideration of rigidity to the base material 11 and the like, the thickness t1 of the film 12 is made relatively thick. For example, as an entire thickness of the base material 11 and film 12, it is preferable that the thickness ranges from 0.05 mm to 2 mm, and particularly 0.2 mm to 0.5 mm. Thus, the film 12 suppresses thermal expansion of the base material 11, while serving as a base of the piezo-electric substrate 1 i.e. as a support member of the base material 11.

In the piezo-electric substrate 1, the film 12 needs to exert the temperature compensation effect of suppressing thermal expansion of the base material 11, while being formed to be a thick film without cracking and curling. For example, a film formed by a CVD method or PVD method exerts the temperature compensation effect, but since the film formation temperature is relatively high, causes curling and cracking, resulting in a large fraction defective. Further, the films by these methods are high in stress in film formation, and cannot be formed to be thick enough to serve as a base of the substrate. Thus, there is a relationship of trade-off between the temperature compensation effect and the stress of the film, and this relationship is affected by the thickness of the base material.

Figure 2:
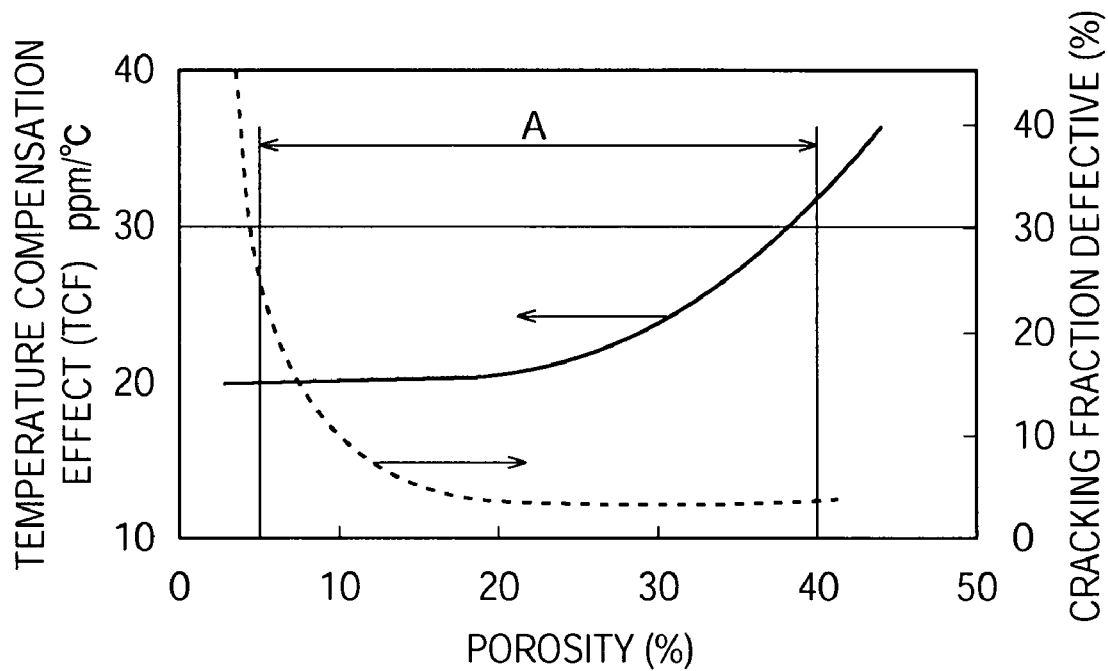
FIG. 2 is a characteristic diagram illustrating the relationship between the temperature compensation effect of the substrate and the stress of cracking fraction defective in relation to the porosity of the film.

The inventors of the present invention noted this respect, found out that by adjusting the porosity of the film, it is possible to achieve compatibility between the temperature compensation effect and stress suppression (cracking fraction defective) of the film, and reached the invention. FIG. 2 is a characteristic diagram illustrating the relationship between the temperature compensation effect of the substrate and the cracking fraction defective in relation to the porosity of the film (herein, an alumina-silica based material is shown as an example.) In FIG. 2, the solid line shows the temperature compensation effect, while the dashed line shows the fraction defective. As can be seen from FIG. 2, in porosities in the range A, the cracking fraction defective is small, while the temperature compensation effect is large (TCF described later is small), and thus the temperature compensation effect and the cracking fraction defective reduction effect can be mutually compatible. From such a result, the film 12 preferably has the porosity ranging from 5% to 40%. Particularly, taking film formation characteristics into account, the film 12 preferably has the porosity ranging from 10% to 20%. In addition, the temperature compensation effect was obtained by measuring the temperature coefficient of frequency (TCF) of the SAW device. Further, the stress of the film was calculated from curling measurement values of the substrate by calculation.

When the film 12 is porous, since its ridigity (Young's modulus) is relatively small, the film 12 may be filled with filling material to enhance the rigidity. For example, after the film 12 is formed on the base material 11, the film 12 is impregnated with SOG (photosensitive coating glass material), resin or the like and cured. By this means, it is possible to enhance the rigidity of the film 12, while preventing unnecessary substances such as a cleaning solvent and the like entering the film 12.

In FIG. 1, the film 12 is comprised of a single layer, but may be comprised of a plurality of layers. By thus forming the film 12 using a plurality of layers, various kinds of materials can be combined, and it is thus possible to adjust the coefficient of linear expansion of the film 12 with ease.

In the piezo-electric substrate 1 as shown in FIG. 1, such an aspect is shown that the film 12 is directly formed on the base material 11. In the invention, the base material 11 may be provided with an undercoat (intermediate film) between the base material 11 and the film 12 to enhance the adhesion of the film 12. Further, the roughness of the base material 11 may be adjusted to enhance the adhesion of the film 12. In addition, materials constituting the undercoat in this case are not limited particularly, as long as the materials produce the effect of enhancing the adhesion of the film 12.

Figure 3A:
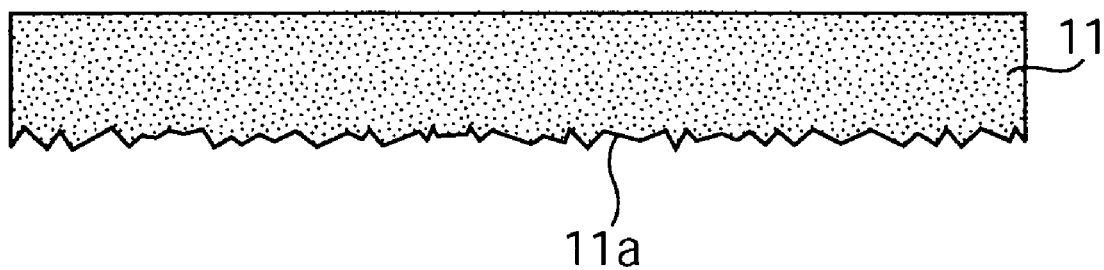
FIGS. 3A and 3B are cross-sectional views to explain a method of manufacturing the piezo-electric substrate according to the first embodiment of the invention.

In a method of manufacturing the piezo-electric substrate of this embodiment, a base material with a roughened main surface is prepared, and a film comprised of a material with a coefficient of linear expansion smaller than a coefficient of linear expansion of the base material is directly formed on the main surface. In other words, as shown in FIG. 3A, the base material 11 with the roughened main surface 11a is prepared. As a method of roughening the main surface of the base material 11, there may be blast, lapping and the like.

Figure 3B:
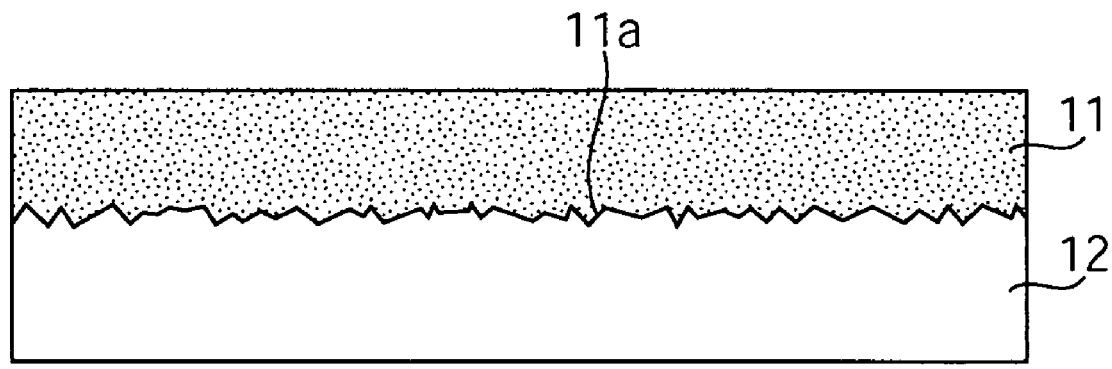

Next, as shown in FIG. 3B, the film 12, which is comprised of the material with the coefficient of linear expansion smaller than the coefficient of linear expansion of the base material 11, is formed on the roughened main surface 11a. As a method of forming the film 12 on the main surface 11a of the base material 11, there may be a coating method such as a screen printing method using slurry, thermal spraying method and the like. Further, when necessary, the film 12 is impregnated with SOG or resin and cured to enhance the rigidity of the film 12.

In the method of forming the film 12 on the main surface 11a of the base material 11, the thermal spraying method is preferable because the method allows the temperature of the base material to be kept at relatively low temperatures (for example, 100° C. or less). The thermal spraying method is a method of using electrical energy (arc, plasma) or combustion energy as a heat source, inserting powder or rod-shaped material of an adherend material to spray onto the surface of the base material as molten or semi-molten fine particles, and thereby forming the film. By adopting the thermal spraying method, it is possible to suppress the thermal effect on the base material 11 during film formation.

In film formation by the thermal spraying method, when molten or semi-molten fine particles reach the base material, the particles are cooled rapidly and solidified on the base material, and fine cracks occur in the fine particles. Then, the particles with such fine cracks are stacked and form a film. Accordingly, the film formed by the thermal spraying method is in a restively porous state, and thus, has a small stress subsequent to film formation. Therefore, the film does not peel off the base material, and it is possible to form a thick film (about several hundred micrometers). As a result, it is possible to form a thick film without curling on the base material.

Next, after performing grinding processing on the formed film to adjust the thickness of the film, grinding processing and/or abrasive processing is performed from the surface (main surface on the side opposite to the roughened main surface) side of the base material 11 to adjust the thickness and surface roughness of the piezo-electric substrate 1. By this means, curling and the like due to thermal expansion and contraction is prevented in the piezo-electric substrate. The piezo-electric substrate 1 according to the invention as shown in FIG. 1 is produced in this way.

Thus obtained piezo-electric substrate 1 is provided with the film (temperature compensation film) 12 comprised of the material with the coefficient of linear expansion smaller than the coefficient of linear expansion of the base material 11 formed on the roughened main surface 11a of the base material 11, and therefore, the film 12 exerts the temperature compensation function. Accordingly, it is possible to sufficiently suppress expansion and contraction of the piezo-electric substrate 1 due to changes in temperature. As a result, for example, when the piezo-electric substrate 1 is used in the SAW device, it is possible to minimize variations in filter characteristics caused by changes in temperature, and make the frequency shift smaller. According to this method, it is possible to manufacture the piezo-electric substrate with the above-mentioned characteristics inexpensively and easily.

When a device is produced using the above-mentioned piezo-electric substrate 1, a device (element) may be formed on the surface of the base material after forming the temperature compensation film on the backside (roughened main surface) of the base material. Alternately, the temperature compensation film may be formed on the roughened main surface after forming a device (element) on the surface (main surface on the side opposite to the roughened main surface) of the base material.

According to this embodiment, the piezo-electric substrate has a base material with a coefficient of linear expansion ranging from $10\times10^{-6}$/K to $20\times10^{-6}$/K having a roughened main surface, and a film that is provided on the main surface and that is comprised of a material with a coefficient of linear expansion ranging from $-1\times10^{-6}$/K to $10\times10^{-6}$/K smaller than the coefficient of linear expansion of the base material, and it is thereby possible to obtain the piezo-electric substrate capable of sufficiently suppressing its expansion and contraction caused by changes in temperature.

Second Embodiment

Figure 4:
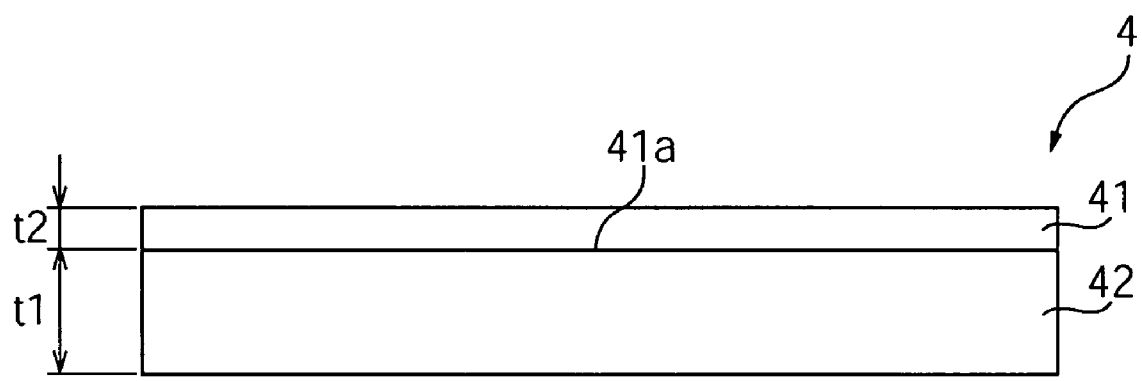
FIG. 4 is a cross-sectional view showing a piezo-electric substrate according to a second embodiment of the invention.

FIG. 4 is a cross-sectional view showing a piezo-electric substrate according to the second embodiment of the invention. A piezo-electric substrate 4 as shown in FIG. 4 is mainly comprised of a base material 41, and a film 42 formed on one main surface of the base material 41. In the base material 41, the main surface on which the film 42 is formed is a main surface 41a that is a mirror-finished surface. Conditions of materials, properties, sizes, porosity, layer structure, formation methods and the like of the base material 41 and film 42 are the same as those in the first embodiment.

The one main surface (backside: interface with the film 42) of the base material 41 is the mirror-finished surface. As a method of polishing the main surface to the mirror-smooth state, it is possible to use typical mirror abrasive methods.

In the piezo-electric substrate 4 of the invention, the film 42 is preferably comprised of a laminate of particles. By the film 42 having such a structure, it is made ease to implement the porosity as described later. In this case, the size of the particles preferably ranges from 5 μm to 300 μm. Particularly, the size of the particles preferably ranges from 20 μm to 200 μm.

Figure 5A:
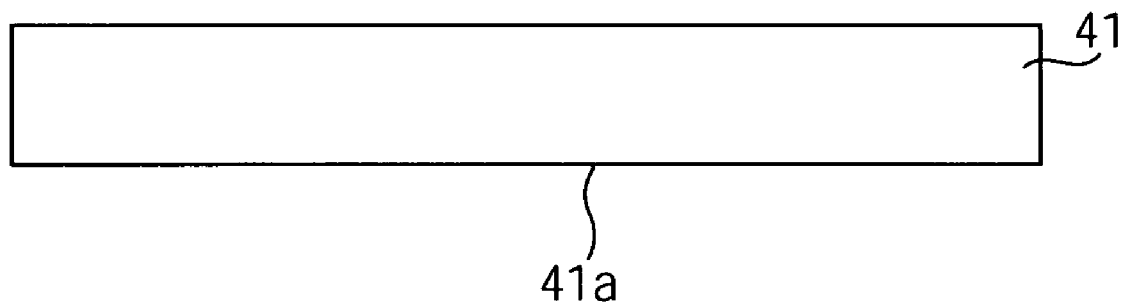
FIGS. 5A and 5B are cross-sectional views to explain a method of manufacturing the piezo-electric substrate according to the second embodiment of the invention.

In a method of manufacturing the piezo-electric substrate of this embodiment, a substrate with a mirror-finished main surface is prepared, and a film comprised of a material with a coefficient of linear expansion smaller than a coefficient of linear expansion of the base material is directly formed on the main surface. In other words, as shown in FIG. 5A, first, the base material 41 with the mirror-finished main surface 41a is prepared.

Figure 5B:
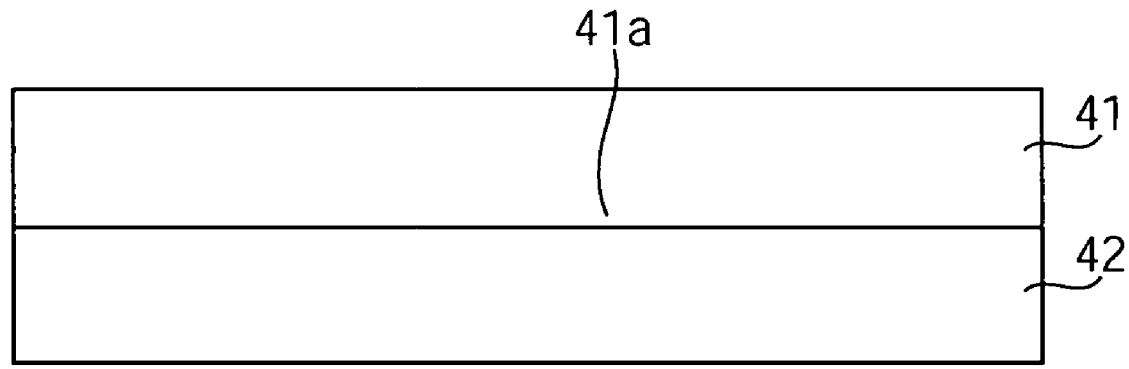

Next, as shown in FIG. 5B, the film 42, which is comprised of the material with the coefficient of linear expansion smaller than the coefficient of linear expansion of the base material 41, is formed on the mirror-finished main surface 41a. As a method of forming the film 42 on the main surface 41a of the base material 41, there may be a coating method using slurry and the like. In this method, the material constituting the film 42 is dispersed in a dispersing medium such as an organic solvent and the like to prepare slurry, and the slurry is coated on the mirror-finished main surface 41a of the base material 41, and dried or subjected to burning to form the film. In the film formed by such a method, the particles of the material constitute a relatively porous state while being fixed. Thus, the stress of the film is small subsequent to film formation. Therefore, the film does not peel off the base material, and it is possible to form a thick film (about several hundred micrometers). As a result, it is possible to form a thick film without curling on the base material. Further, when necessary, the film 42 may be impregnated with SOG or a resin and cured to enhance the rigidity of the film 42.

Next, grinding processing and/or abrasive processing is performed from the surface (main surface on the side opposite to the mirror-finished main surface) side of the base material 41 to adjust the thickness of the piezo-electric substrate 4. By this means, curling and the like due to thermal expansion and contraction is prevented in the piezo-electric substrate. The piezo-electric substrate 4 according to this embodiment as shown in FIG. 4 is produced in this way.

Thus obtained piezo-electric substrate 4 is provided with the film (temperature compensation film) 42 comprised of the material with the coefficient of linear expansion smaller than the coefficient of linear expansion of the base material 41 formed on the mirror-finished main surface 41a of the base material 41, and therefore, the film 42 exerts the temperature compensation function. Accordingly, it is possible to sufficiently suppress expansion and contraction of the piezo-electric substrate 4 due to changes in temperature. As a result, for example, when the piezo-electric substrate 4 is used in the SAW device, it is possible to minimize variations in filter characteristics caused by changes in temperature, and make the frequency shift smaller. According to this method, it is possible to manufacture the piezo-electric substrate with the above-mentioned characteristics inexpensively and easily.

When a device is produced using the above-mentioned piezo-electric substrate 4, a device (element) may be formed on the surface of the base material after forming the temperature compensation film on the backside (mirror-finished main surface) of the base material. Alternately, the temperature compensation film may be formed on the mirror-finished main surface after forming a device (element) on the surface (main surface on the side opposite to the mirror-finished main surface) of the base material.

According to this embodiment, the piezo-electric substrate has a base material with a coefficient of linear expansion ranging from $10\times10^{-6}$/K to $20\times10^{-6}$/K having a mirror-finished main surface, and a film that is provided on the main surface and that is comprised of a material with a coefficient of linear expansion ranging from $-1\times10^{-6}$/K to $10\times10^{-6}$/K smaller than the coefficient of linear expansion of the base material, and it is thereby possible to obtain the piezo-electric substrate capable of sufficiently suppressing its expansion and contraction caused by changes in temperature.

Described next are Examples that were performed to clarify the effect of the invention.

EXAMPLE 1

One main surface (backside) of a lithium tantalate substrate (LT substrate) 21 with a coefficient of linear expansion of $16.1\times10^{-6}$/K, a diameter of 4 inches, and a thickness of 0.25 mm was roughened by lapping. In addition, the roughening processing was performed using a grinder with abrasive grains of GC#2500. The coefficient of linear expansion was measured in a differential expansion mode of an apparatus for thermomechanical analysis (TMA-8310) of the system of Thermoplus 2 (Rigaku Corporation) (in the Industrial Technology Center)

Figure 6A:

Next, as shown in FIG. 6A, powder of mullite (alumina-silica) was sprayed on the roughening-processed main surface by a thermal spraying method, and a temperature compensation film 22 with a thickness of 0.5 mm was formed on the backside of the LT substrate 21. In addition, the thermal spraying processing was performed using a direct plasma thermal spraying apparatus with use of Ar and H2 plasma gases in power supply output of 40 kW. The porosity of the temperature compensation film 22 was measured and 9%. In addition, the porosity of the temperature compensation film 22 was measured by a method of generally used cross-section observation. In other words, the cross-section of the temperature compensation film 22 was observed using an electron microscope (SEM), image processing was performed on void (hole) portions, and a rate of occupied void (hole) portions to the cross-section area was calculated as the porosity. Further, the porosity was measured in several portions, and an average value of the obtained values was determined as the porosity of the temperature compensation film 22.

Figure 6B:
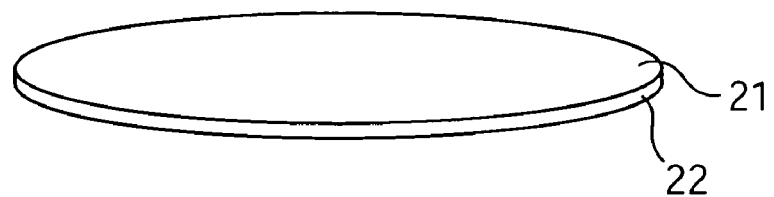

Next, as shown in FIG. 6B, grinding processing and/or abrasive processing was performed from the surface (main surface on the side opposite to the roughened main surface) side of the LT substrate 21, and the thickness of the LT substrate 21 was adjusted to 20 μm. Further, the surface roughness was adjusted to 0.2 μm (Ra=20 μm). At this point, the temperature compensation film 22 formed by the thermal spraying method neither had any cracks, nor peeled off the LT substrate 21.

Figure 6C:
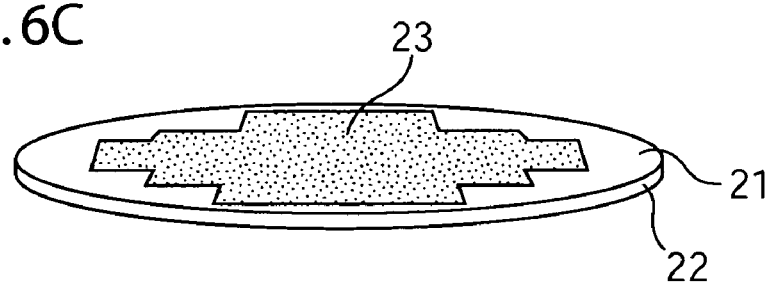
Figure 6D:
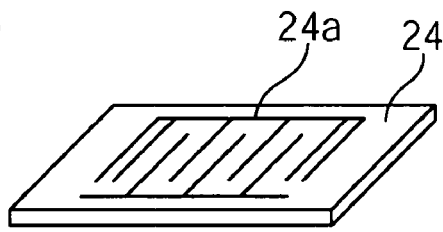

Then, as shown in FIG. 6C, an aluminum film was formed on the surface of the LT substrate 21, and patterning (element formation) for an SAW device was performed on the aluminum film, and a pattern 23 was formed. Subsequently, as shown in FIG. 6D, the LT substrate 21 was diced, and an SAW device chip 24 with comb-shaped electrodes 24a was produced.

Figure 6E:
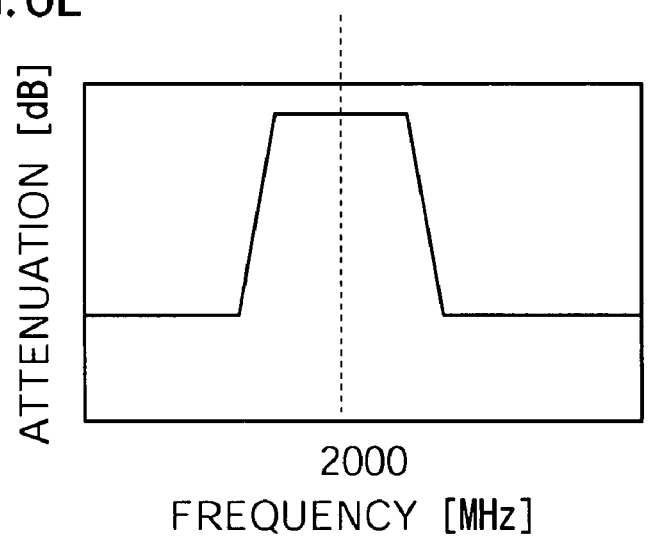
FIG. 6E is a diagram illustrating frequency characteristics of the piezo-electric substrate of the invention.

In thus obtained SAW device chip (Example 1), when the temperature compensation effect was examined by the above-mentioned method, TCF was about 30 ppm/° C., and thus greatly improved as compared with TCF of the LT alone (about 45 ppm/° C.). Further, in the SAW device chip (Example 1), the frequency shift due to changes in temperature was examined. The result is shown in FIG. 6E. In addition, evaluations of the frequency shift due to changes in temperature were made by examining attenuation profiles of a frequency band (center frequency of 2000 MHz) in the temperature range of −30° C. to 80° C. As can be seen from FIG. 6E, the SAW device using the piezo-electric substrate according to the invention hardly caused the frequency shift even when the temperature changed. For this reason, it is considered that the coefficient of linear expansion of the piezo-electric substrate is suppressed and reduced as much as possible, and that expansion and contraction of the piezo-electric substrate is suppressed.

EXAMPLE 2

One main surface (backside) of a lithium tantalate substrate (LT substrate) 21 with a coefficient of linear expansion of 16.1×10−6/K, a diameter of 4 inches, and a thickness of 0.25 mm was polished to be a mirror-finished surface. The mirror surface processing was performed using a grinder with colloidal silica. The coefficient of linear expansion was measured in a differential expansion mode of the apparatus for thermomechanical analysis (TMA-8310) of the system of Thermoplus 2 (Rigaku Corporation) (in the Industrial Technology Center)

Next, slurry obtained by dispersing powder of mullite (alumina-silica) in a solvent including a silica-based inorganic adhesive was coated on the mirror-finish-processed surface and dried, and a temperature compensation film 22 with a thickness of 0.3 mm was formed on the backside of the LT substrate 21 as shown in FIG. 6A.

Next, after performing grinding processing on the formed film to adjust the thickness of the film, as shown in FIG. 6B, grinding processing and/or abrasive processing was performed from the surface (main surface on the side opposite to the mirror-finish-processed main surface) side of the LT substrate 21, and the thickness of the LT substrate 21 was adjusted to 20 μm. At this point, the formed temperature compensation film 22 neither had any cracks, nor peeled off the LT substrate 21.

Then, as shown in FIG. 6C, an aluminum film is formed on the surface of the LT substrate 21, and patterning (element formation) for an SAW device was performed on the aluminum film, and a pattern 23 was formed. Subsequently, as shown in FIG. 6D, the LT substrate 21 was diced, and an SAW device chip 24 with comb-shaped electrodes 24a was produced.

In thus obtained SAW device chip (Example 2), when the temperature compensation effect was examined by the above-mentioned method, TCF was about 30 ppm/° C., and thus greatly improved as compared with TCF of the LT alone (about 45 ppm/° C.). Further, in the SAW device chip (Example 2), the frequency shift due to changes in temperature was examined. The result is shown in FIG. 6E. In addition, evaluations of the frequency shift due to changes in temperature were made by examining attenuation profiles of a frequency band (center frequency of 2000 MHz) in the temperature range of −30° C. to 80° C. As can be seen from FIG. 6E, the SAW device using the piezo-electric substrate according to the invention hardly caused the frequency shift even when the temperature changed. For this reason, it is considered that the coefficient of linear expansion of the piezo-electric substrate is suppressed and reduced as much as possible, and that expansion and contraction of the piezo-electric substrate is suppressed.

COMPARATIVE EXAMPLE

Figure 7A:
Figure 7B:

As shown in FIG. 7A, a sapphire substrate 32 with a diameter of 4 inches and a thickness of 0.4 mm was joined to one main surface (backside) of an LT substrate 31 with a diameter of 4 inches, and a thickness of 0.5 mm at room temperature. In addition, in junction at room temperature, junction surfaces of the LT substrate 31 and sapphire substrate 32 were activated using an argon ion beam. Next, as shown in FIG. 7B, grinding processing and/or abrasive processing was performed from the surface side of the LT substrate 31, and the thickness of the LT substrate 31 was adjusted to 20 μm.

Figure 7C:
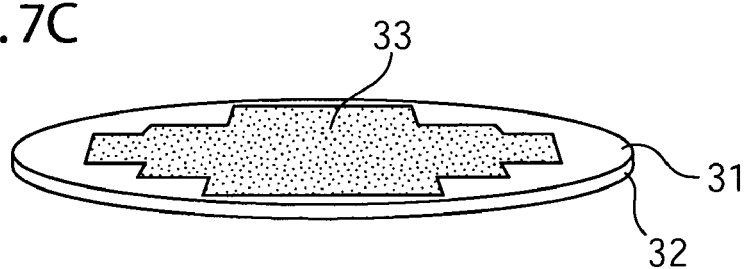
Figure 7D:
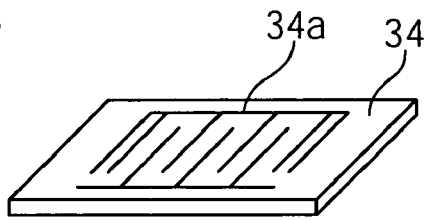

Then, as shown in FIG. 7C, an aluminum film is formed on the surface of the LT substrate 31, and patterning for an SAW device was performed on the aluminum film, and a pattern 33 was formed. Subsequently, as shown in FIG. 7D, the LT substrate 31 was diced, and an SAW device chip 34 with comb-shaped electrodes 34a was produced.

Figure 7E:
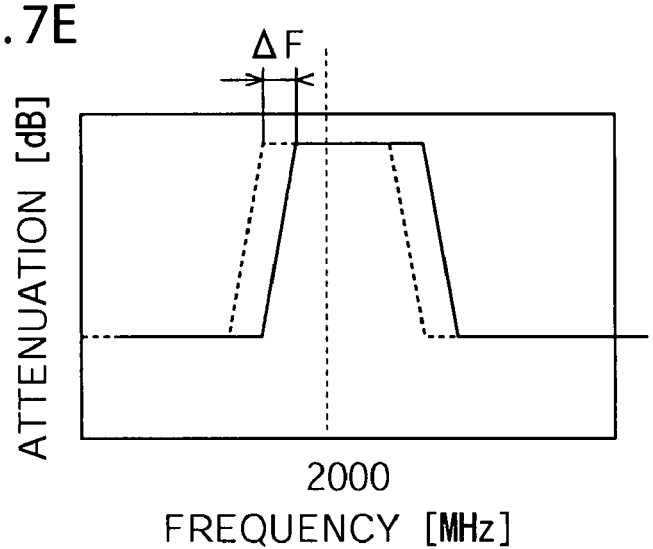
FIG. 7E is a diagram illustrating frequency characteristics of the conventional piezo-electric substrate.

In thus obtained SAW device chip (Comparative Example), when the temperature compensation effect was examined as in the Examples, TCF was about 40 ppm/° C., and thus not improved very much. Further, in the SAW device chip (Comparative Example), the frequency shift due to changes in temperature was examined. The result is shown in FIG. 7E. As can be seen from FIG. 7E, the SAW device using the conventional piezo-electric substrate caused the frequency shift ΔF of about 10 MHz when the temperature changed. For this reason, it is considered that the coefficient of linear expansion of the piezo-electric substrate is not suppressed, and that the piezo-electric substrate expands or contracts.

The present invention is not limited to the above-mentioned embodiments, and is capable of been carried into practice with various modifications thereof. In the above-mentioned embodiments, the thermal spraying method and the coating method using slurry are described, as the film formation method enabling the stress of the film subsequent to film formation to be kept small. However, in the invention, as well as the thermal spraying method and the coating method using slurry, any film formation methods may be used as long as the methods provide a film formation state such that material particles are fixed and constitute a porous state. Further, the present invention is capable of being carried into practice with various modifications thereof without departing from the scope of the invention.

The invention claimed is:

1. A piezo-electric substrate comprising:
   a base material with a coefficient of linear expansion ranging from $10\times10^{-6}$/K to $20\times10^{-6}$/K having a roughened main surface; and
   a film that is provided on the main surface and that is comprised of a material with a coefficient of linear expansion ranging from $-1\times10^{-6}$/K to $10\times10^{-6}$/K smaller than the coefficient of linear expansion of the base material;
   wherein the film has a porosity ranging from 5% to 40%; and
   wherein the base material and the porosity of the film are cooperable to minimize frequency shifts due to temperature.

2. The piezo-electric substrate according to claim 1, wherein the film is comprised of a laminate of molten or non-molten particles.

3. The piezo-electric substrate according to claim 2, wherein a size of the particles ranges from 5 μm to 300 μm.

4. The piezo-electric substrate according to claim 1, wherein the material with the coefficient of linear expansion smaller than the coefficient of linear expansion of the base material is at least one selected from a group consisting of Ti, W, Mo, Ta, Si and alloys thereof, aluminum oxide, silicon oxide, magnesium oxide, zirconium oxide, titanium oxide, silicon carbide, boron carbide, aluminum nitride, silicon nitride and solid solutions of compounds thereof, and mixtures of the metals and compounds.

5. The piezo-electric substrate according to claim 1, wherein the film has a thickness ranging from 0.05 mm to 2 mm.

6. The piezo-electric substrate according to claim 1, wherein the base material is comprised of a material selected from a group consisting of lithium tantalate, lithium niobate, quartz, lithium borate and zinc oxide.

7. The piezo-electric substrate according to claim 1, wherein an undercoat is provided between the base material and the film.

8. A piezo-electric element comprising:
   the piezo-electric substrate according to claim 1; and
   an element provided on another main surface on the side opposite to the roughened main surface of the piezo-electric substrate.

* * * * *